(12) United States Patent
Sutardja et al.

(10) Patent No.: US 8,736,374 B2
(45) Date of Patent: *May 27, 2014

(54) CLASS AB AMPLIFIERS

(71) Applicant: Marvell Semiconductor Inc., Santa Clara, CA (US)

(72) Inventors: Sehat Sutardja, Los Altos Hills, CA (US); Farbod Aram, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/769,700

(22) Filed: Feb. 18, 2013

(65) Prior Publication Data

US 2013/0154743 A1    Jun. 20, 2013

Related U.S. Application Data

(63) Continuation of application No. 13/044,183, filed on Mar. 9, 2011, now Pat. No. 8,378,750.

(60) Provisional application No. 61/312,167, filed on Mar. 9, 2010.

(51) Int. Cl.
*H03F 3/18* (2006.01)
*H03F 3/04* (2006.01)
*H03F 3/26* (2006.01)

(52) U.S. Cl.
CPC ..................................... *H03F 3/265* (2013.01)
USPC .......................................... 330/264; 330/305

(58) Field of Classification Search
USPC .......................................... 330/277, 264, 305
See application file for complete search history.

(56) References Cited

U.S. PATENT DOCUMENTS

| 7,215,201 B2 | 5/2007 | Roine |
| 7,323,939 B2 * | 1/2008 | Han et al. ...................... 330/311 |
| 7,764,124 B2 | 7/2010 | Aram |

(Continued)

FOREIGN PATENT DOCUMENTS

DE        41 04 980        8/1992

OTHER PUBLICATIONS

International Search Report and Written Opinion for corresponding International Application No. PCT/US2011/027756, mailed Aug. 10, 2011, 21 pages.

(Continued)

*Primary Examiner* — Robert Pascal
*Assistant Examiner* — Khiem Nguyen

(57) ABSTRACT

An amplifier includes a first switch and a second switch each having a first terminal and a second terminal. The first terminals of the first and second switches respectively communicate with a first tank circuit and a second tank circuit. The second terminal of the second switch communicates with the second terminal of the first switch. A first capacitance having a first terminal connected directly to (i) the second terminal of the first switch and (ii) the second terminal of the second switch. A second terminal of the first capacitance is connected directly to a first input voltage of the amplifier. A first load is connected across (i) the first terminal of the first switch and (ii) the first terminal of the second switch. The amplifier generates a first output across the first load.

20 Claims, 9 Drawing Sheets

(56) References Cited

U.S. PATENT DOCUMENTS

| | | |
|---|---|---|
| 7,834,691 B2 | 11/2010 | Aram |
| 8,058,938 B2 | 11/2011 | Aga et al. |
| 8,081,032 B1 | 12/2011 | Aram |
| 2008/0079494 A1* | 4/2008 | Aram .......................... 330/277 |

OTHER PUBLICATIONS

Suematsu et al; CMOS/BICMOS Power Amplifier Technology Trend in Japan; GAAS IC Sumpsium; 23rd Annual IEEE Gallium Arsenide Integrated Circuit Symposium; Technical Digest 2001; Oct. 21-24, 2001; pp. 107-110.

* cited by examiner

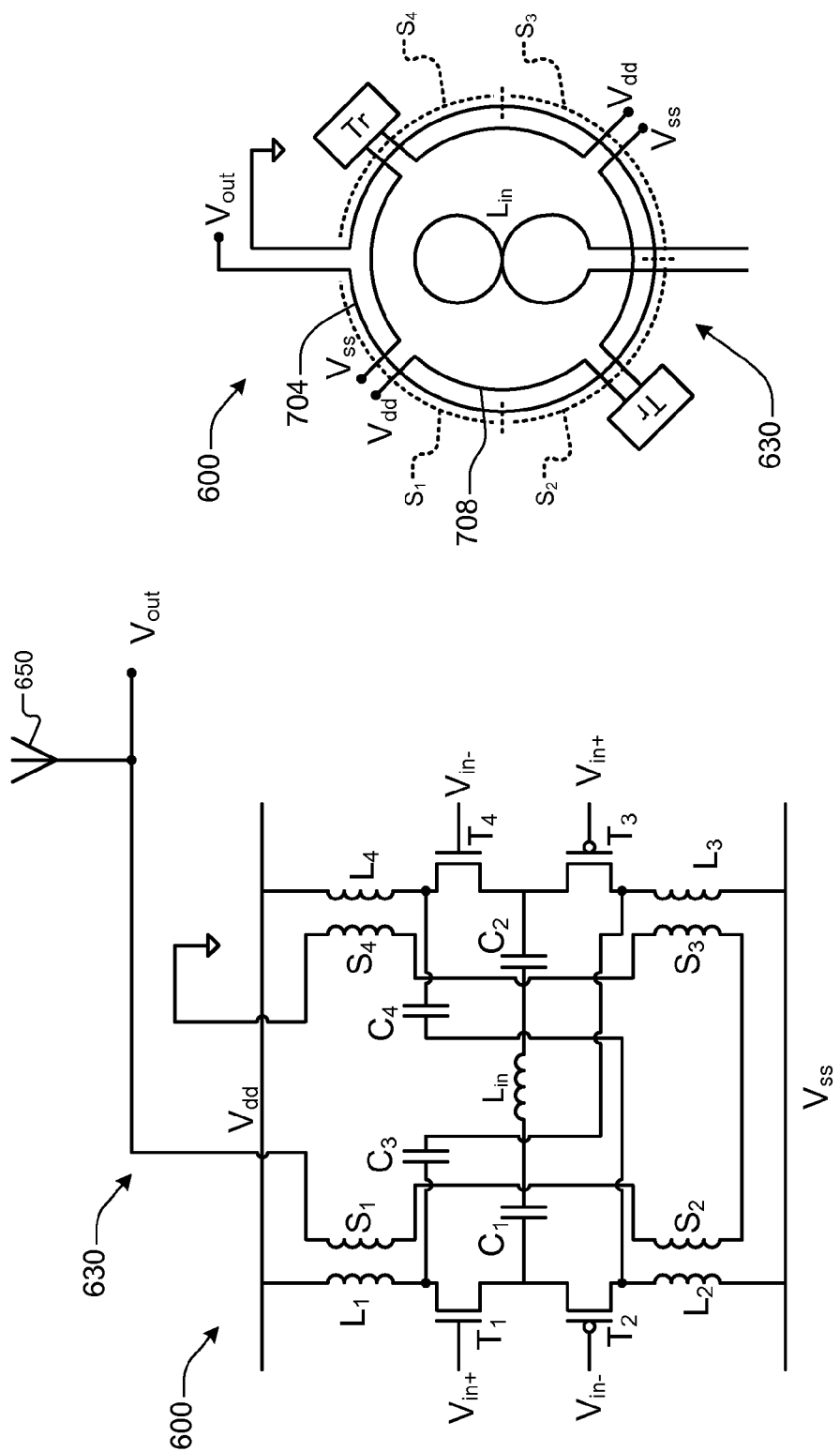

CLASS AB AMPLIFIERS

CROSS-REFERENCE TO RELATED APPLICATIONS

This is a continuation of U.S. patent application Ser. No. 13/044,183, filed on Mar. 9, 2011, which claims the benefit of U.S. Provisional Application No. 61/312,167, filed on Mar. 9, 2010. The entire disclosures of the above applications are incorporated herein by reference.

FIELD

The present disclosure relates to amplifiers, and more particularly to class AB amplifiers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Class A amplifiers operate over an entire cycle of an input signal. An output signal is a scaled-up replica of the input signal. Class A amplifiers have a maximum efficiency of about 50% with inductive output coupling and about 25% with capacitive output coupling.

In Class A amplifiers, a transistor is biased such that the transistor is always conducting. The transistor is operated over a linear portion of the transistor's transfer characteristic. Because the transistor is always conducting, power is drawn from the power supply even when there is no input. If high output power is needed, power consumption (and the accompanying heat) may become significant.

Class B amplifiers amplify during half of an input cycle. As a result, Class B amplifiers tend to increase distortion but have higher efficiency than Class A amplifiers. Class B amplifiers have a maximum efficiency over 75%. Transistors are switched off half of the time and do not dissipate power at this time.

Class B amplifiers may use complementary transistor pairs (a "push-pull" transistor arrangement). Complementary devices amplify opposite halves of the input signal. Mismatch or crossover distortion may occur when re-joining the halves of the signal. One solution to the mismatch problem involves biasing the transistors to be just on, rather than completely off when not in use. This biasing approach is called Class AB operation. In other words, Class AB amplifying devices may include a class B output stage that is biased so that both transistors are conducting around a crossover point.

SUMMARY

A class AB amplifier includes a first inductor having a first terminal in communication with a voltage source terminal. A first transistor has a drain terminal in communication with a second terminal of the first inductor. A second transistor has a source terminal in communication with a source terminal of the first transistor. A second inductor has a first terminal in communication with a drain terminal of the second transistor and a second terminal in communication with a reference potential. The drain terminals of the first transistor and the second transistor are capacitively coupled together.

In other features, a first capacitance has a first terminal in communication with the source terminals of the first transistor and the second transistor. A second terminal of the first capacitance is in communication with a voltage input to the class AB amplifier.

In other features, a first capacitance has a first terminal in communication with gate terminals of the first transistor and the second transistor. A second terminal of the first capacitance is in communication with a voltage input to the class AB amplifier.

In other features, a first variable capacitance is connected in parallel with the first inductor. A second variable capacitance is connected in parallel with the second inductor. A first capacitance has a first terminal in communication with the drain terminal of the first transistor and a second terminal in communication with the drain terminal of the second transistor.

In other features, N capacitances have first terminals in communication with the drain terminal of the first transistor. N resistances have first terminals in communication with second terminals of respective ones of the N capacitances and have second terminals in communication with the drain terminal of the second transistor, wherein N is an integer greater than zero.

In other features, a third inductor has a first terminal in communication with the voltage source terminal. A third transistor has a drain terminal in communication with a second terminal of the third inductor. A fourth transistor has a source terminal in communication with a source terminal of the third transistor. A fourth inductor has a first terminal in communication with a drain terminal of the fourth transistor and a second terminal in communication with a reference potential. The drain terminals of the third transistor and the fourth transistor are capacitively coupled.

In other features, first and second capacitances are connected in series with each other and connected in parallel to the drain terminals of the first transistor and the second transistor, respectively. Third and fourth capacitances are connected in series with each other and connected in parallel to the drain terminals of the third transistor and the fourth transistor, respectively.

In other features, a fifth capacitance has a first terminal connected between the first and second capacitances and to the source terminals of the first transistor and the second transistor. The fifth capacitance has a second terminal connected between the third and fourth capacitances and to the source terminals of the third transistor and the fourth transistor. A sixth capacitance has one end that communicates with the first terminals of the first and second capacitances. A seventh capacitance has one end that communicates with the first terminals of the third and fourth capacitances.

In other features, an input driver includes a third transistor having a gate terminal in communication with an input signal, a tank circuit in communication with a terminal of the third transistor and a matching network in communication with the terminal of the third transistor and the source terminals of the first transistor and the second transistor.

In other features, a first capacitance has a first terminal in communication with the source terminals of the first transistor and the second transistor. A second capacitance has a first terminal in communication with the source terminals of the third transistor and the fourth transistor. A fifth inductor is in communication with second terminals of the first and second capacitances.

In other features, a fifth transistor has a gate terminal in communication with a first polarity of a differential input signal and a first terminal in communication with the second terminal of the first capacitance. A sixth transistor has a gate terminal in communication with a second polarity of the differential input signal and a first terminal in communication with the second terminal of the second capacitance.

In other features, a power combiner includes fifth, sixth, seventh and eighth inductors coupled to the first, second, third and fourth inductors, respectively. An antenna is connected to the power combiner. The first, second, third and fourth transistors and the first, second, third and fourth inductors are connected in a first loop. The fifth, sixth, seventh and eighth inductors are connected in a second loop that is arranged one of inside or outside of the first loop.

In other features, a first capacitance has a first terminal in communication with the source terminals of the first transistor and the second transistor. A second capacitance has a first terminal in communication with the source terminals of the third transistor and the fourth transistor. A fifth inductor is in communication with second terminals of the first and second capacitances. The first, second, third and fourth transistors and the first, second, third and fourth inductors are connected in a first loop. The fifth, sixth, seventh and eighth inductors are connected in a second loop that is arranged one of inside or outside of the first loop. The fifth inductor is arranged in a figure "8" shape. The fifth inductor is located inside of the first loop and the second loop.

In other features, the first and second capacitances and the fifth inductor have a first impedance at a center frequency of the class AB amplifier and have second and third impedances at second and third harmonic frequencies, respectively, of the class AB amplifier. The second and third impedances are greater than the first impedance. The first transistor is an NMOS transistor and the second transistor is a PMOS transistor.

A class AB amplifier includes a first inductor having a first terminal in communication with a voltage source terminal. A first transistor has a drain terminal in communication with a second terminal of the first inductor. A second transistor has a source terminal in communication with a source terminal of the first transistor. A second inductor has a first terminal in communication with a drain terminal of the second transistor and a second terminal in communication with a reference potential. A third inductor has a first terminal in communication with the voltage source terminal. A third transistor has a drain terminal in communication with a second terminal of the third inductor. A fourth transistor has a source terminal in communication with a source terminal of the third transistor. A fourth inductor has a first terminal in communication with a drain terminal of the fourth transistor and a second terminal in communication with a reference potential. The drain terminals of the first transistor and the third transistor are capacitively coupled. The drain terminals of the second transistor and the fourth transistor are capacitively coupled. A first polarity of a differential signal is input to gates of the first and third transistors and a second polarity of the differential signal is input to gates of the second and fourth transistors.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 9 is an electrical schematic of ninth push-pull class AB amplifier according to the present disclosure;

FIG. 10 is an example partial layout of a push-pull class AB amplifier with a power combiner according to the present disclosure.

DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical OR. It should be understood that steps within a method may be executed in different order without altering the principles of the present disclosure.

Figure 2:
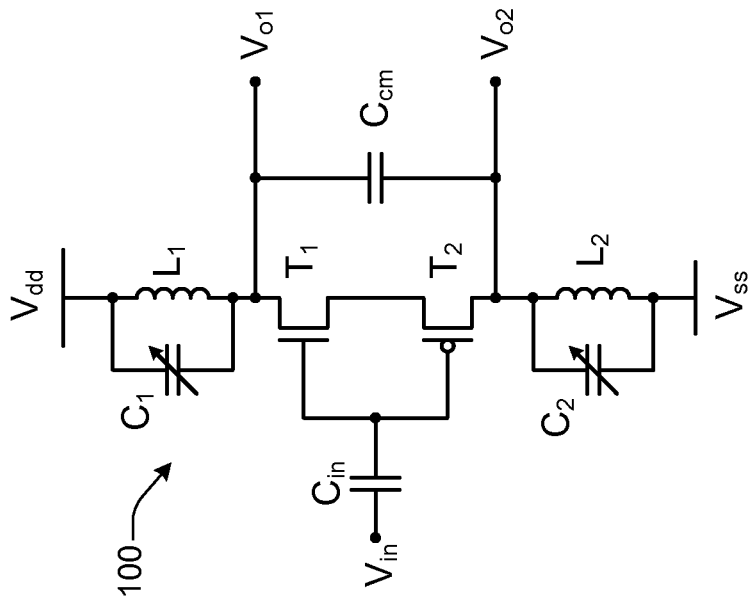
FIG. 2 is an electrical schematic of second push-pull class AB amplifier according to the present disclosure.
Figure 1:
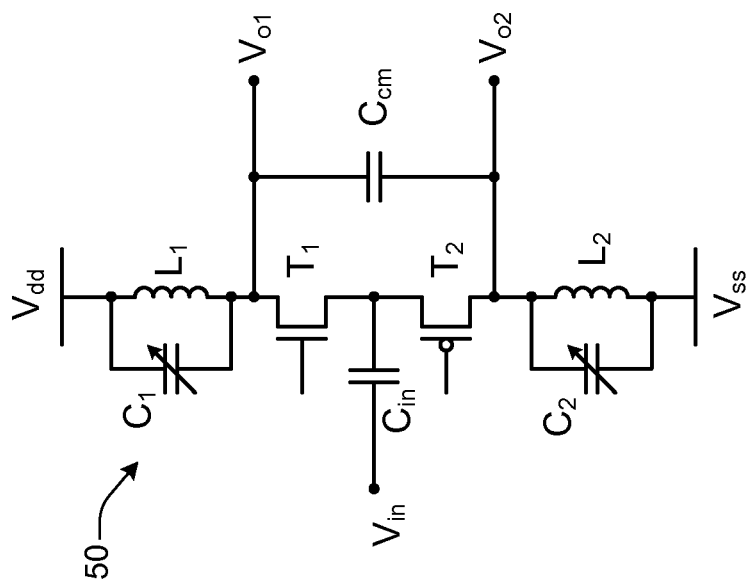
FIG. 1 is an electrical schematic of a first push-pull class AB amplifier according to the present disclosure.

Referring now to FIGS. 1 and 2, single-ended arrangements of push-pull class AB amplifiers 50 and 100 are shown. In FIG. 1, the amplifier 50 is arranged in a common gate configuration. The amplifier 50 includes a first inductor $L_1$, a first transistor $T_1$, a second transistor $T_2$ and a second inductor $L_2$, which are connected in series. The first transistor $T_1$ may be an NMOS transistor and the second transistor $T_2$ may be a PMOS transistor, although other types of transistors can be used. Inputs of the transistors $T_1$ and $T_2$ may be connected to AC ground or another bias or reference signal.

Variable capacitances $C_1$ and $C_2$ may be connected in parallel with the inductors $L_1$ and $L_2$, respectively. The inductor $L_1$ may be connected to a reference potential $V_{dd}$. The inductor $L_2$ may be connected to a ground potential $V_{ss}$.

A capacitance $C_{cm}$ may be connected to drain terminals of the first and second transistors $T_1$ and $T_2$. An input signal may be applied via an input capacitance $C_{in}$ to source terminals of the first and second transistors $T_1$ and $T_2$. Output signals $V_{o1}$ and $V_{o2}$ may be taken across terminals of the capacitance $C_{cm}$.

In FIG. 2, the push-pull class AB amplifier 100 is shown. The amplifier 100 is arranged in a common source configuration. The source terminals of the transistors $T_1$ and $T_2$ may be connected to AC ground or another bias or reference signal. The amplifier 100 is similar to the amplifier 50 except that the input signal $V_{in}$ is applied to gates of the first and second transistors $T_1$ and $T_2$.

In both FIGS. 1 and 2, the capacitance $C_{cm}$ removes even harmonics from the output signals $V_{o1}$ and $V_{o2}$ due to cancelling of the opposite phase of the even harmonics. The capacitance $C_{cm}$ tends to help transistor mismatch and to reduce distortion. Unlike conventional power amplifiers, the amplifiers 50 and 100 can have a voltage swing that is greater than $2V_{dd}$. The source node between the transistors $T_1$ and $T_2$ is floating and a low side can go below ground. The value of the capacitance $C_{cm}$ may be selected to be larger than the capacitances $C_1$ and $C_2$. The output signals $V_{o1}$ and $V_{o2}$ may be recombined in any suitable manner. In one example, inductive coupling via transformers may be used to recombine the output signals $V_{o1}$ and $V_{o2}$, as will be described below.

Figure 3:
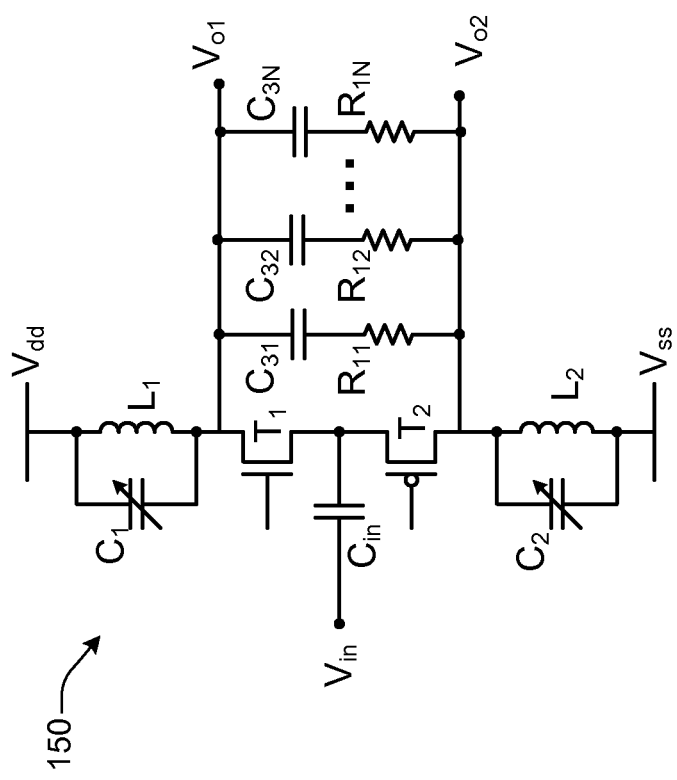
FIG. 3 is an electrical schematic of third push-pull class AB amplifier according to the present disclosure.

Referring now to FIG. 3, another push-pull class AB amplifier 150 is shown. The capacitance $C_{cm}$ is replaced by one or more series-connected capacitance and resistance pairs, which are connected in parallel across the first and second transistors $T_1$ and $T_2$. In particular, capacitances $C_{31}$, $C_{32}$, ..., and $C_{3N}$ are connected in series with resistances $R_{11}$, $R_{12}$, ..., and $R_{1N}$, respectively, where N is an integer greater than zero. In some implementations, the capacitances $C_{31}$, $C_{32}$, ..., and $C_{3N}$ are selected to have the same or different values. In some implementations, the resistances $R_{11}$, $R_{12}$, ..., and $R_{1N}$ are selected to have the same or different values. Using the capacitances and resistances may tend to reduce oscillation.

Figure 4:
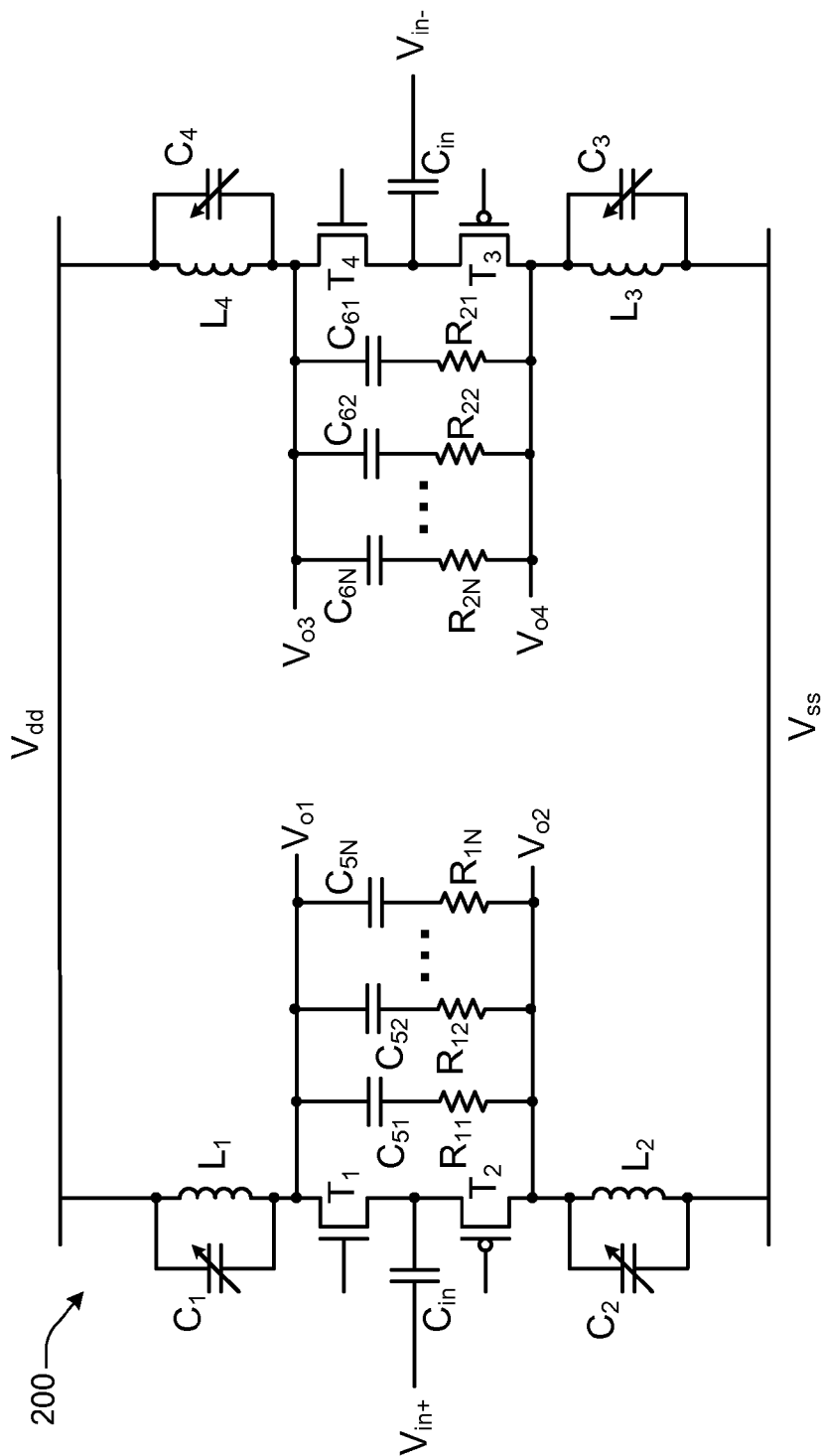
FIG. 4 is an electrical schematic of fourth push-pull class AB amplifier according to the present disclosure.

Referring now to FIG. 4, another push-pull class AB amplifier 200 is shown. The amplifier 200 is a differential implementation of the amplifier 150 of FIG. 3. The amplifier 200 further includes a third inductor $L_3$, a third transistor $T_3$, a fourth transistor $T_4$ and a fourth inductor $L_4$, which are connected in series. The fourth transistor $T_4$ may be an NMOS transistor and the third transistor $T_3$ may be a PMOS transistor, although other types of transistors can be used. Inputs of the transistors $T_1$ and $T_2$ and $T_3$ and $T_4$ may be connected to AC ground or another bias or reference signal.

Variable capacitances $C_3$ and $C_4$ may be connected in parallel with the inductors $L_3$ and $L_4$, respectively. The inductor $L_4$ may be connected to the reference potential $V_{dd}$. The inductor $L_3$ may be connected to the ground potential $V_{ss}$. A differential input signal may be applied via an input capacitance $C_{in}$ to source terminals of the third and fourth transistors $T_3$ and $T_4$. Output signals $V_{o3}$ and $V_{o4}$ may be taken across terminals of the third and fourth transistors $T_3$ and $T_4$.

Capacitances $C_{51}, C_{52}, \ldots$, and $C_{5N}$ are connected in series with resistances $R_{11}, R_{12}, \ldots$, and $R_{1N}$, respectively, where N is an integer greater than zero. One or more pairs of the capacitances $C_{51}, C_{52}, \ldots$ and $C_{5N}$ and the resistances $R_{11}, R_{12}, \ldots$ and $R_{1N}$ are connected in parallel across the third and fourth transistors $T_1$ and $T_2$. Capacitances $C_{61}, C_{62}, \ldots$, and $C_{6N}$ are connected in series with resistances $R_{21}, R_{22}, \ldots$, and $R_{2N}$, respectively, where N is an integer greater than zero. One or more pairs of the capacitances $C_{61}, C_{62}, \ldots$ and $C_{6N}$ and the resistances $R_{21}, R_{22}, \ldots$ and $R_{2N}$ are connected in parallel across the third and fourth transistors $T_3$ and $T_4$.

Figure 5:
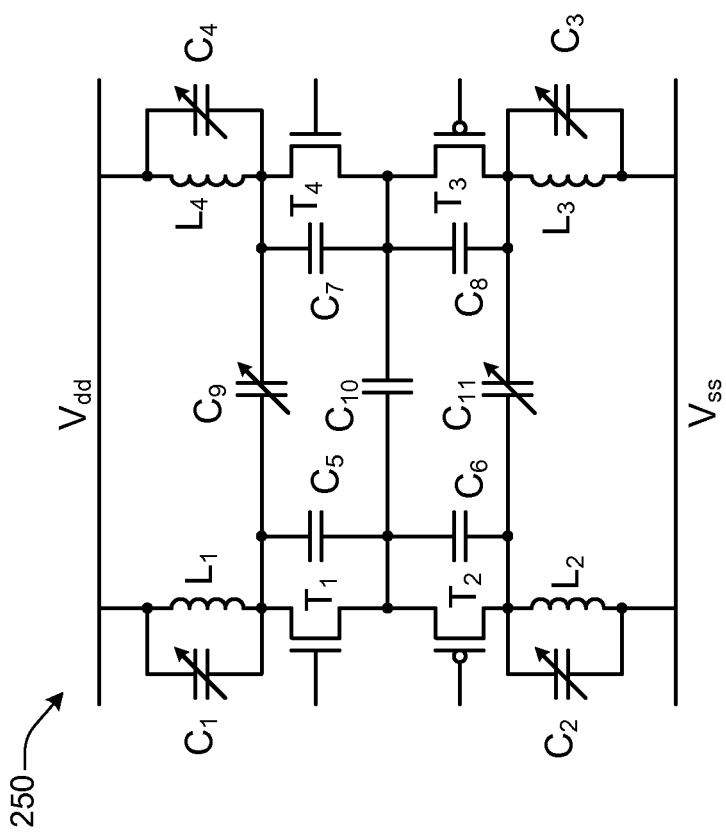
FIG. 5 is an electrical schematic of fifth push-pull class AB amplifier according to the present disclosure.

Referring now to FIG. 5, another push-pull amplifier 250 is shown. Additional capacitances $C_5$ to $C_{11}$ may be provided. The capacitances $C_5$ and $C_6$ replace one of the common mode capacitances $C_{cm}$ and are connected in series with each other and in parallel across the transistors $T_1$ and $T_2$. The capacitances $C_7$ and $C_8$ replace the other common mode capacitance $C_{cm}$ and are connected in series with each other and in parallel across the transistors $T_3$ and $T_4$. One end of a capacitance $C_{10}$ is connected to first terminals of the capacitances $C_5$ and $C_6$ and to the source terminals of the transistors $T_1$ and $T_2$. Another end of the capacitance $C_{10}$ is connected to first terminals of the capacitances $C_7$ and $C_8$ and to the source terminals of the transistors $T_3$ and $T_4$.

One end of a variable capacitance $C_{11}$ is connected to a second terminal of the capacitance $C_6$ and to the drain terminal of the transistors $T_2$. Another end of the variable capacitance $C_{11}$ is connected to a second terminal of the capacitance $C_8$ and to the drain terminal of the transistor $T_3$. One end of a variable capacitance $C_9$ is connected to a second terminal of the capacitance $C_5$ and to the drain terminal of the transistors $T_1$. Another end of the variable capacitance $C_9$ is connected to a second terminal of the capacitance $C_7$ and to the drain terminal of the transistor $T_4$. For example, an inductive coupling loop may couple with the inductors $L_1, L_2, L_3$ and $L_4$ to drive an output such as an antenna.

Figure 6:
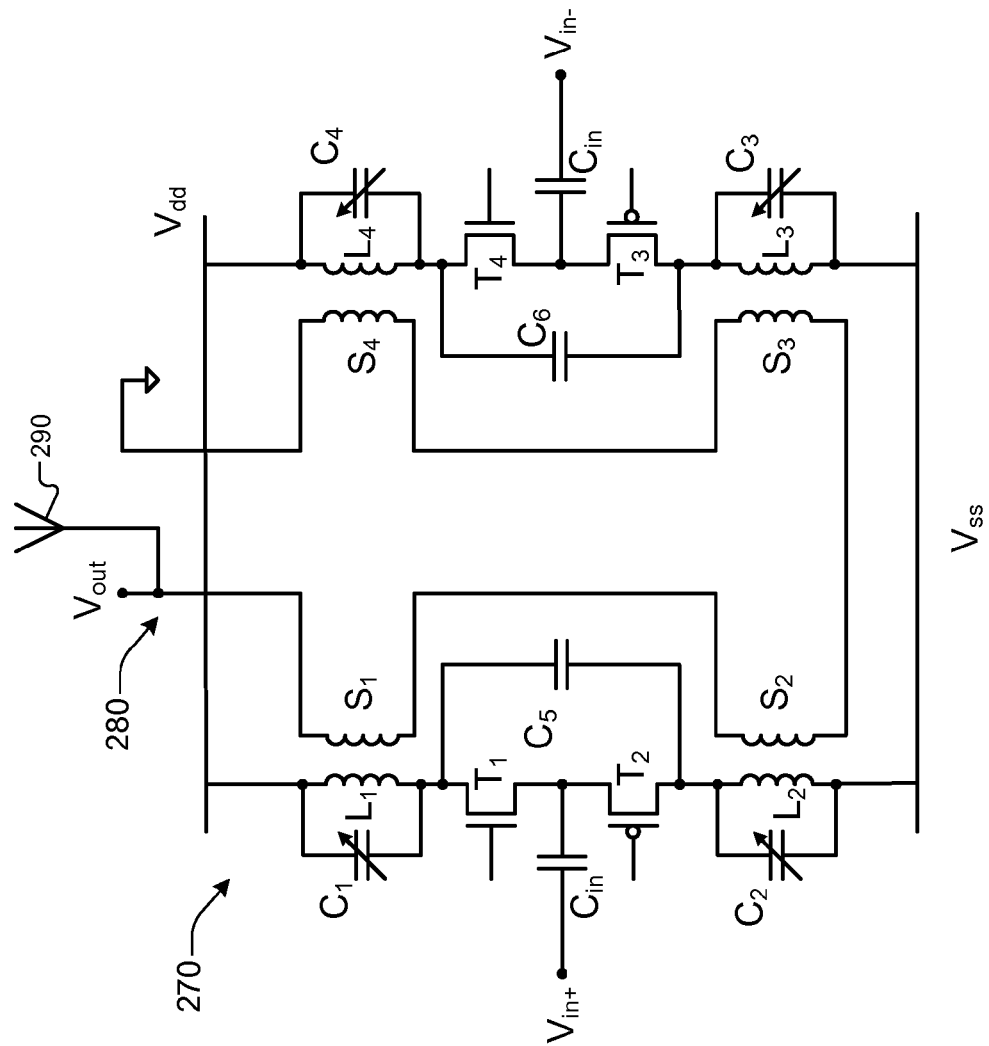
FIG. 6 is an electrical schematic of sixth push-pull class AB amplifier according to the present disclosure.

Referring now to FIG. 6, another push-pull class AB amplifier 270 is shown and includes a power combiner 280. The amplifier 270 includes a first inductor $L_1$, a first transistor $T_1$, a second transistor $T_2$ and a second inductor $L_2$, which are connected in series.

The amplifier 270 further includes a third inductor $L_3$, a third transistor $T_3$, a fourth transistor $T_4$ and a fourth inductor $L_4$, which are connected in series. Capacitances $C_1$, $C_2$, $C_3$ and $C_4$ may be variable capacitances that are arranged in parallel with the inductors $L_1, L_2, L_3$ and $L_4$. Common mode capacitances $C_5$ and $C_6$ are arranged in parallel with transistors $T_1$ and $T_2$ and $T_3$ and $T_4$, respectively.

The power combiner 280 includes first, second, third and fourth inductors $S_1$, $S_2$, $S_3$ and $S_4$, respectively, which are coupled to the first, second, third and fourth inductors $L_1, L_2, L_3$ and $L_4$, respectively, to create first, second, third and fourth transformers. In some examples, the output may be coupled to an antenna (not shown) or another load.

Figure 7:
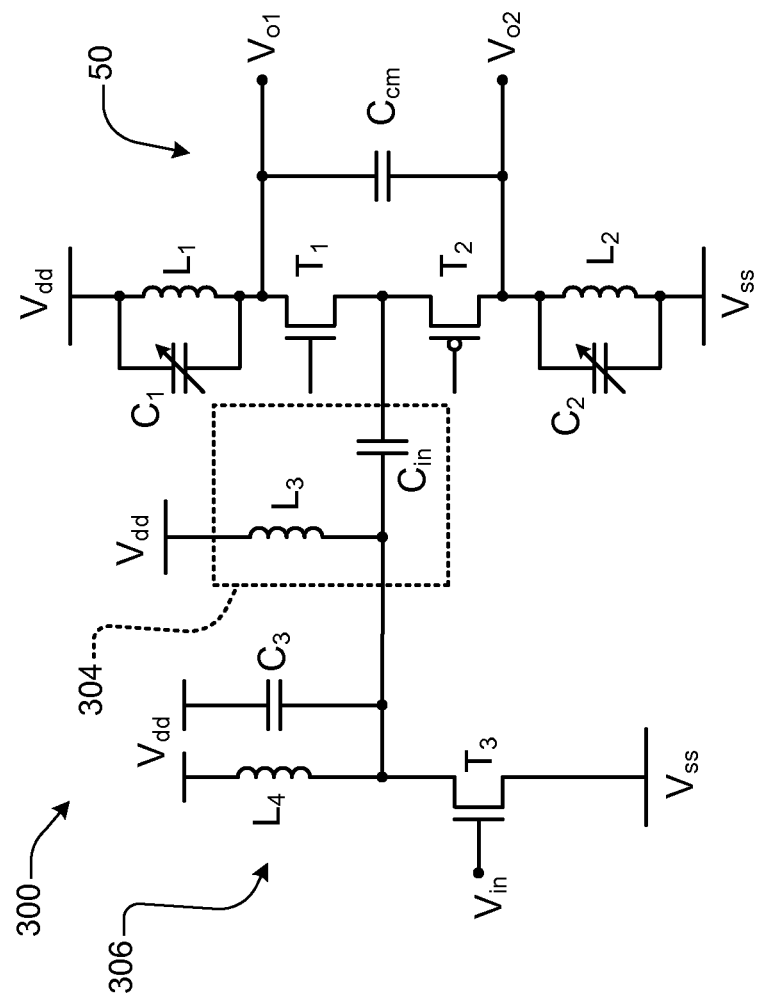
FIG. 7 is an electrical schematic of seventh push-pull class AB amplifier according to the present disclosure.

Referring now to FIG. 7, an example of an input driver 300 for the single ended amplifier 50 is shown. A matching network 304 includes the capacitance $C_{in}$ and an inductor $L_3$. A tank circuit 306 includes an inductor $L_4$ and a capacitance $C_3$. An input signal $V_{in}$ is input to a gate of a transistor $T_3$. The tank circuit 306 and the matching network 304 couple the input signal to the sources of the transistors $T_1$ and $T_2$.

Figure 8:
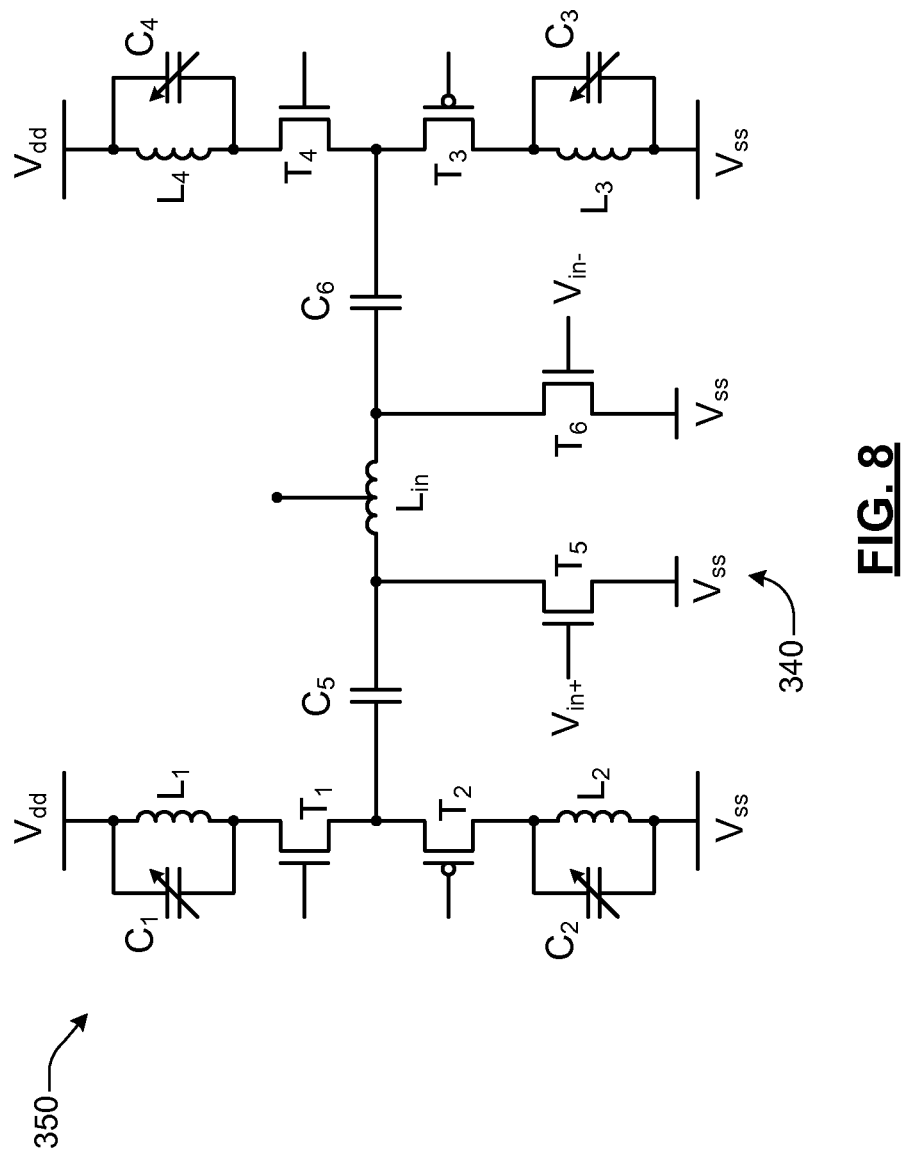
FIG. 8 is an electrical schematic of eighth push-pull class AB amplifier according to the present disclosure.

Referring now to FIG. 8, an example of an input driver 340 for a differential amplifier 350 is shown. The amplifier 350 includes the components of the amplifier 50. The amplifier 350 further includes a third inductor $L_3$, a third transistor $T_3$, a fourth transistor $T_4$ and a fourth inductor $L_4$, which are connected in series. Inputs of the transistors $T_1, T_2, T_3$, and $T_4$ may be connected to AC ground or another bias or reference signal. Variable capacitances $C_3$ and $C_4$ may be connected in parallel with the inductors $L_3$ and $L_4$, respectively. The inductor $L_4$ may be connected to the reference potential $V_{dd}$. The inductor $L_3$ may be connected to the ground potential $V_{ss}$.

Capacitance $C_5$, inductor $L_{in}$ and capacitance $C_6$ are connected in series between the sources of the transistors $T_1$ and $T_2$ and the sources of transistors $T_3$ and $T_4$. Drains (or sources) of the transistors $T_5$ and $T_6$ are connected between the inductor $L_{in}$ and the capacitances $C_5$ and $C_6$, respectively. Sources (or drains) of the transistors $T_5$ and $T_6$ are connected to $V_{ss}$. One polarity of the differential input signal $V_{in+}$ is coupled to a gate of the transistor $T_5$ and the other polarity of the differential input signal $V_{in-}$ is coupled to a gate of the transistor $T_6$. The inductor $L_{in}$ may have a center tap that may be connected to a bias signal, a reference potential or a ground potential.

The connection provided by the capacitances $C_5$ and $C_6$ and the inductor $L_{in}$ provides source degeneration. The connection provides a low impedance connection such as a short circuit at a center frequency and a higher impedance connection at other frequencies. For example, the connection has high impedance at second and third harmonic frequencies.

Referring now to FIG. 9, another push-pull class AB amplifier 600 is shown and includes a power combiner 630. The amplifier 600 includes a first inductor $L_1$, a first transistor $T_1$, a second transistor $T_2$ and a second inductor $L_2$, which are connected in series. The amplifier 600 further includes a third inductor $L_3$, a third transistor $T_3$, a fourth transistor $T_4$ and a fourth inductor $L_4$, which are connected in series. A first capacitance $C_1$, an inductor $L_{in}$ and a second capacitance $C_2$ are connected in series. The first capacitance $C_1$ is also connected to source terminals of the first and second transistors $T_1$ and $T_2$. The second capacitance $C_2$ is also connected to source terminals of the third and fourth transistor $T_3$ and $T_4$. Capacitance $C_3$ is connected to drains of the transistors $T_1$ and $T_3$. Capacitance $C_4$ is connected to drains of the transistors $T_2$ and $T_4$. A first polarity of the differential signal $V_{in+}$ is input to gates of transistors $T_1$ and $T_3$. A second polarity of the differential signal $V_{in-}$ is input to gates of transistors $T_2$ and $T_4$.

The power combiner 630 includes first, second, third and fourth inductors $S_1$, $S_2$, $S_3$ and $S_4$, respectively, which are coupled to the first, second, third and fourth inductors $L_1$, $L_2$, $L_3$ and $L_4$, respectively, to create first, second, third and fourth transformers. In some examples, the output may be coupled to an antenna (not shown) or another load.

Referring now to FIG. 10, an example layout of the amplifier 600 and the power combiner 630 is shown. A first loop 704 includes the first, second, third and fourth inductors $S_1$, $S_2$, $S_3$ and $S_4$, respectively. A second loop 708 provides connections to the transistor pairs, $V_{dd}$ and $V_{ss}$. The first and second loops 704 and 708 may have a circular, elliptical, rectangular, square or other generally closed shape. The inductor $L_{in}$ may be arranged inside or outside of the first and second loops 704 and 708. The inductor $L_{in}$ may have a figure "8" shape. The first loop 704 may be arranged inside or outside of the second loop 708 in a plan view. The current in the first loop 704 may flow through the inductors $S_1$, $S_2$, $S_3$ and $S_4$ in the same direction.

Figure 11:
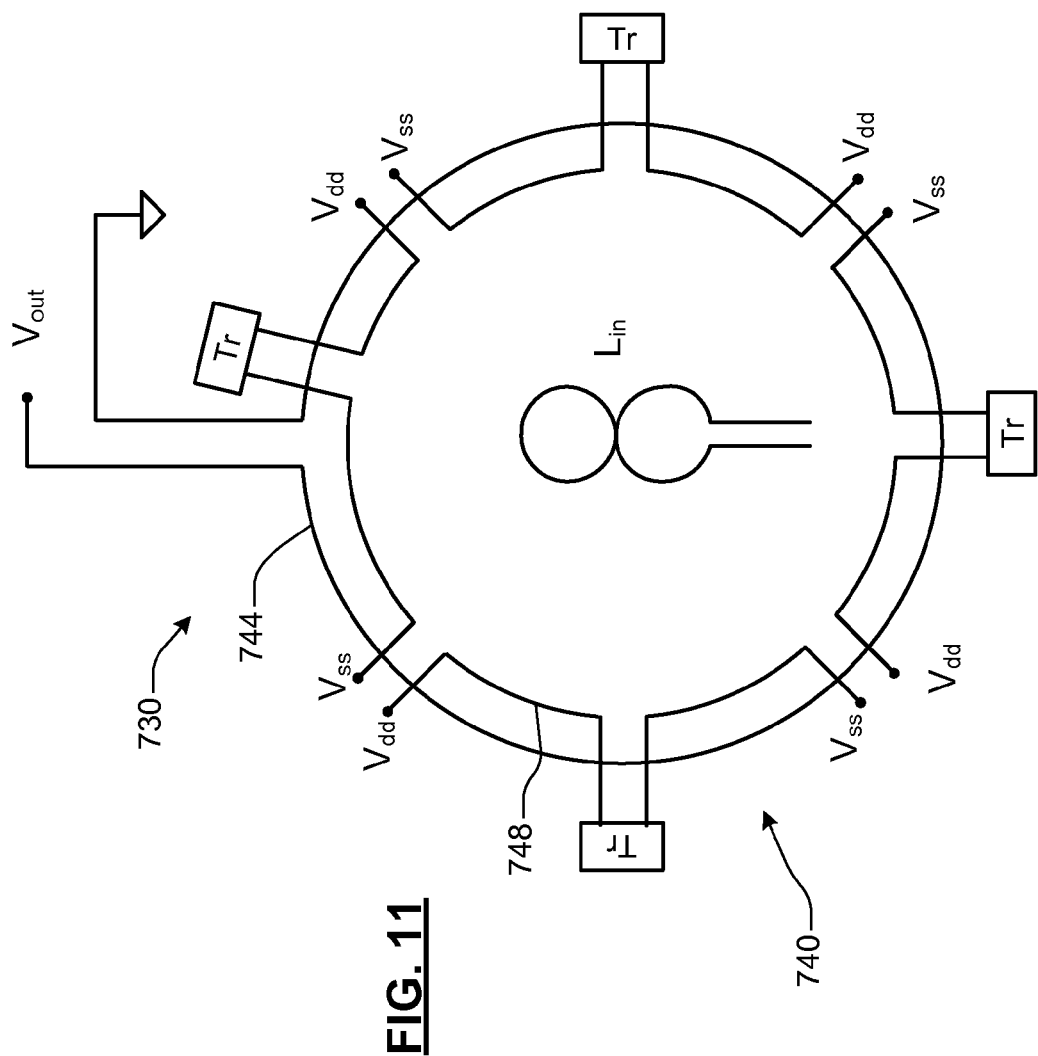
FIG. 11 is an example partial layout of another push-pull class AB amplifier with a power combiner according to the present disclosure.

While two legs are shown for example in FIGS. 5 and 6, additional legs with additional transistor pairs can be used. Referring now to FIG. 11, an example layout of an amplifier 730 and a power combiner 740 for four pairs of transistors is shown. A first loop 744 includes inductors that couple with inductors in a second loop 748. For example only, the first and second loops 744 and 748 may have a circular, elliptical, rectangular, square or other generally-closed shape. The inductor $L_{in}$ may be arranged inside or outside of the first and second loops 744 and 748. The first loop 744 may be arranged inside or outside of the second loop 748 in a plan view.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An amplifier comprising:
a first switch having a first terminal and a second terminal, wherein the first terminal communicates with a first tank circuit;
a second switch having a first terminal and a second terminal, wherein the first terminal of the second switch communicates with a second tank circuit, and wherein the second terminal of the second switch communicates with the second terminal of the first switch;
a first capacitance having a first terminal and a second terminal, wherein the first terminal of the first capacitance is connected directly to (i) the second terminal of the first switch and (ii) the second terminal of the second switch, and wherein the second terminal of the first capacitance is connected directly to a first input voltage of the amplifier; and
a first load connected across (i) the first terminal of the first switch and (ii) the first terminal of the second switch, wherein the amplifier generates a first output across the first load.

2. The amplifier of claim 1, further comprising:
the first tank circuit; and
the second tank circuit,
wherein the first tank circuit and the second tank circuit each comprises (i) an inductance and (ii) a variable capacitance.

3. The amplifier of claim 1, further comprising:
the first tank circuit; and
the second tank circuit,
wherein the first tank circuit is connected to a first potential, and wherein the second tank circuit is connected to a second potential.

4. The amplifier of claim 1, wherein the first load includes a capacitance.

5. The amplifier of claim 1, wherein the first load includes a resistance and a capacitance connected in series.

6. The amplifier of claim 1, further comprising:
a third switch having a first terminal and a second terminal, wherein the first terminal of the third switch communicates with a third tank circuit;
a fourth switch having a first terminal and a second terminal, wherein the first terminal of the fourth switch communicates with a fourth tank circuit, and wherein the second terminal of the fourth switch communicates with the second terminal of the third switch;
a second capacitance having a first terminal and a second terminal, wherein the first terminal of the second capacitance is connected directly to (i) the second terminal of the third switch and (ii) the second terminal of the fourth switch, and wherein the second terminal of the second capacitance is connected directly to a second input voltage of the amplifier; and
a second load connected across (i) the first terminal of the third switch and (ii) the first terminal of the fourth switch,
wherein the amplifier generates a second output across the second load.

7. The amplifier of claim 6, further comprising:
the third tank circuit; and
the fourth tank circuit,
wherein the third tank circuit and the fourth tank circuit each comprises (i) an inductance and (ii) a variable capacitance.

8. The amplifier of claim 6, further comprising:
the third tank circuit; and
the fourth tank circuit,
wherein the third tank circuit is connected to a first potential, and wherein the fourth tank circuit is connected to a second potential.

9. The amplifier of claim 6, wherein the second load includes a capacitance.

10. The amplifier of claim 6, wherein the second load includes a resistance and a capacitance connected in series.

11. An amplifier comprising:
a first switch having a first terminal and a second terminal, wherein the first terminal communicates with a first tank circuit;
a second switch having a first terminal and a second terminal, wherein the first terminal of the second switch communicates with a second tank circuit, and wherein the second terminal of the second switch communicates with the second terminal of the first switch;
a first capacitance having a first terminal and a second terminal, wherein the first terminal of the first capacitance is connected directly to (i) the second terminal of the first switch and (ii) the second terminal of the second switch; and a third switch having a first terminal and a control terminal, wherein the first terminal of the third switch is connected directly to the second terminal of the first capacitance, and wherein the control terminal receives an input voltage of the amplifier.

12. The amplifier of claim 11, further comprising:
a load connected across (i) the first terminal of the first switch and (ii) the first terminal of the second switch,
wherein the amplifier generates an output across the load.

13. The amplifier of claim 12, wherein the load includes a capacitance.

14. The amplifier of claim 11, wherein the third switch has a second terminal in communication with a third tank circuit, the amplifier further comprising:
an inductance connected (i) to the second terminal of the first capacitance and (ii) across the third tank circuit.

15. The amplifier of claim 14, further comprising:
the first tank circuit;
the second tank circuit; and
the third tank circuit,
wherein the first tank circuit, the second tank circuit, and the third tank circuit each comprises (i) an inductance and (ii) a variable capacitance.

16. The amplifier of claim 14, further comprising:
the first tank circuit;
the second tank circuit; and
the third tank circuit,
wherein the first tank circuit and the third tank circuit are connected to a first potential, and
wherein the second tank circuit and the second terminal of the third switch are connected to a second potential.

17. An amplifier comprising:
a first switch having a first terminal and a second terminal, wherein the first terminal communicates with a first tank circuit;
a second switch having a first terminal and a second terminal, wherein the first terminal of the second switch communicates with a second tank circuit, and wherein the second terminal of the second switch communicates with the second terminal of the first switch;
a first capacitance having a first terminal and a second terminal, wherein the first terminal of the first capacitance is connected directly to (i) the second terminal of the first switch and (ii) the second terminal of the second switch, and wherein the second terminal of the first capacitance is connected directly to a first input voltage of the amplifier; and
a second capacitance having a first terminal and a second terminal, wherein the first terminal of the second capacitance is connected directly to the first terminal of the first switch, and wherein the second terminal of the second capacitance is connected directly to the first terminal of the second switch.

18. The amplifier of claim 17, further comprising:
a third switch having a first terminal and a second terminal, wherein the first terminal of the third switch communicates with a third tank circuit;
a fourth switch having a first terminal and a second terminal, wherein the first terminal of the fourth switch communicates with a fourth tank circuit, and wherein the second terminal of the fourth switch communicates with the second terminal of the third switch;
a third capacitance having a first terminal and a second terminal, wherein the first terminal of the third capacitance is connected directly to (i) the second terminal of the third switch and (ii) the second terminal of the fourth switch, and wherein the second terminal of the third capacitance is connected directly to a second input voltage of the amplifier; and
a fourth capacitance connected across (i) the first terminal of the third switch and (ii) the first terminal of the fourth switch.

19. The amplifier of claim 18, further comprising the first, second, third, and fourth tank circuits, wherein the first, second, third, and fourth tank circuits each comprises (i) an inductance and (ii) a variable capacitance, the amplifier further comprising:
four inductances (i) connected in series and (ii) coupled respectively to the inductances of the first, second, third, and fourth tank circuits,
wherein the series-connected inductances have a first terminal and a second terminal,
wherein the first terminal of the series-connected inductances communicates with an antenna,
wherein the second terminal of the series-connected inductances communicates with a reference potential, and
wherein the amplifier generates an output at the first terminal of the series-connected inductances.

20. The amplifier of claim 19, wherein:
the inductances of the first, second, third, and fourth tank circuits are connected in a first loop,
the four inductances are connected in a second loop, and
the first loop and the second loop are concentric.

* * * * *